United States Patent
Bieth et al.

(10) Patent No.: US 6,204,786 B1
(45) Date of Patent: Mar. 20, 2001

(54) CIRCUIT FOR THE ACQUISITION OF BINARY ANALOG SIGNALS

(75) Inventors: Philippe Bieth, Saclay; Christian Pitot, Boulogne Billancourt; Michel Prost, Paris, all of (FR)

(73) Assignee: Sextant Avionique, Velizy Villacoublay (FR)

( * ) Notice: Subject to any disclaimer, the term of this patent is extended or adjusted under 35 U.S.C. 154(b) by 0 days.

(21) Appl. No.: 09/291,044

(22) Filed: Apr. 14, 1999

(30) Foreign Application Priority Data

Apr. 17, 1998 (FR) .................................................. 98 04859

(51) Int. Cl.⁷ .......................... H03M 1/00; H03K 3/037; H03K 3/12; H03K 3/286; H03K 3/356
(52) U.S. Cl. ........................................... 341/133; 327/206
(58) Field of Search ..................................... 327/205, 206; 341/133; 323/259; 710/128, 129; 604/67

(56) References Cited

U.S. PATENT DOCUMENTS

| 4,418,332 | 11/1983 | Mefford . |
| 5,936,448 | * 8/1999 | Ohie et al. ........................... 327/205 |

FOREIGN PATENT DOCUMENTS

| 38 37 821 | 5/1990 | (DE) . |
| 0 601 750 | 6/1994 | (EP) . |
| 0 664 612 | 7/1995 | (EP) . |
| 93/12579 | 6/1993 | (WO) . |

OTHER PUBLICATIONS

Di Cataldo et al, "A Neural A/D Converter Utilizing Schmitt Trigger," IEEE, 1078–1081, May 1990.*
Filanovsky et al, "CMOS Schmitt Trigger Design," IEEE, 46–49, Jan. 1994.*
Patent Abstracts of Japan vol. 3, No. 85, (E–124), Jul. 21, 1979 and JP 54 061863 A, May 18, 1979.

* cited by examiner

Primary Examiner—Patrick Wamsley
(74) Attorney, Agent, or Firm—Oblon, Spivak, McClelland, Maier & Neustadt, P.C.

(57) ABSTRACT

The disclosure relates to the acquisition of a binary analog signal at input of a digital integrated circuit after its range of voltage variation has been matched with that acceptable by the digital integrated circuit by means of a resistive divider bridge. It is usual to define the architecture of an ASIC digital integrated circuit on the basis of libraries of pre-characterized cells. The disclosed device is designed to increase the possibilities of choice open to the integrated circuit designer, in enabling him to one pre-characterized cell of a Schmitt trigger for its top switching threshold and another for its bottom switching threshold. It consists of a circuit comprising, at input, a bank of Schmitt triggers of different types, followed by a discrete-rendering logic circuit deducing the logic state of the binary input analog signal of the combination of the output states of the input Schmitt triggers.

14 Claims, 5 Drawing Sheets

CIRCUIT FOR THE ACQUISITION OF BINARY ANALOG SIGNALS

BACKGROUND OF THE INVENTION

1. Field of the Invention

The present invention relates to the acquisition of binary analog signals at input of a digital integrated circuit.

The dialog between the computer and its peripherals or between several computers or again between a human operator and a computer is often carried out by means of discrete or Boolean analog electrical signals evolving around two voltage thresholds which are at a variable distance from each other, depending on the tolerated noise margins. The voltages then brought into play may be great as compared with the usually accepted voltages in the digital integration technologies most commonly used today (voltages of 5 V), thus making it necessary to obtain a voltage matching. This matching conventionally makes use of an analog interface stage with a resistive divider bridge possibly incorporating a filtering capacitor. When the voltage matching is done, it is necessary to determine the binary state of the signal by comparing its instantaneous voltage with a reference level. This is obtained by subjecting the signal coming from the analog interface stage with a level comparator made by digital technology. Since the slopes of evolution of the signals acquired by means of an analog interface stage are often very gradual as compared with the switching speeds of current digital technologies, there is a great risk of bringing about the oscillation of the digital input stage with the consequence of increased consumption, risky operation and, finally, a consequent diminishing of reliability. To overcome this, there are known ways of using Schmitt triggers instead of simple level comparators. These Schmitt triggers have a switching hysteresis with two distinct thresholds: a top threshold in the upward direction and a bottom threshold in the downward direction.

2. Description of the Prior Art

The input digital stage using Schmitt triggers is made in a cell of the digital integrated circuit. Consequently, it has the drawback wherein its electrical characteristics, hence its switching thresholds, are fixed during the characterizing of its integration cell. Now, in integration technologies, the characterizing of the cells is a costly operation which it is sought to avoid to the greatest possible extent. Thus, it is usual to define the architecture of an ASIC (Applications Specific Integrated Circuit) that is prediffused or pre-characterized on the basis of various types of pre-characterized cells established in advance and pooled in a library. The designer of an ASIC therefore, in order to make a binary analog signal discrete (i.e. draw a two-state logic signal out of it), has only one choice in a limited set of several types of Schmitt trigger input digital stages with fixed characteristics, a set often limited to two types, one using the TTL standard and the other using the CMOS standard. It sometimes happens that, in the set of Schmitt trigger input digital stages available, none is really suitable. The result of this is that, unless the costly solution of developing a specific cell is adopted, the designer of an ASIC circuit must opt for an available type of Schmitt trigger digital input stage having top and bottom switching thresholds which are not at the desired levels but are simply close to them. The digital integrated circuit obtained then shows greater sensitivity to noise or requires a more complex matching stage.

It is an aim of the present invention to combat this drawback by providing a designer of an ASIC digital integrated circuits with increased possibilities in the choice of the top and bottom switching threshold levels of an input digital stage despite the limitations dictated by the fact that there is a limited number of Schmitt trigger input digital stages pre-characterized in a library.

SUMMARY OF THE INVENTION

An object of the invention is a circuit for the acquisition of a binary analog signal comprising several Schmitt triggers with different switching thresholds at input parallel-connected by their inputs and followed by at least one discrete-rendering logic circuit (i.e. a logic circuit deriving a two-state logic signal from a binary analog signal) deducing the state of the binary analog signal from the combination of the output states of the input Schmitt triggers.

Advantageously, the discrete-rendering logic circuit comprises feedback means enabling a temporary setting of the signal level at input of the Schmitt triggers.

The discrete-rendering logic circuit may be used to increase or reduce the apparent hysteresis of two input Schmitt triggers having staged top and bottom switching thresholds. When it is used to increase the apparent hysteresis, it comprises a logic flip-flop circuit which changes its state, on the one hand, when the Schmitt trigger with the highest top switching threshold passes to the logic 1 level and, on the other hand, when the Schmitt trigger with the lowest bottom switching threshold passes to the logic 0 level. When it is used to reduce the apparent hysteresis of two Schmitt triggers having staged top and bottom switching thresholds, it comprises a logic flip-flop circuit which changes its state, on the one hand, when the Schmitt trigger with the highest bottom switching threshold passes to the logic 0 level and, on the other hand, when the Schmitt trigger with the lowest top switching threshold passes to the logic 1 level, and also comprises feedback means which, for a brief instant, force the Schmitt trigger with the highest top switching threshold to cross its top threshold as soon as the input signal has crossed the top threshold of the other Schmitt trigger in the upward direction, and force the Schmitt trigger with the lowest bottom switching threshold to cross its bottom threshold as soon as the input signal has crossed the bottom threshold of the other Schmitt trigger in the downward direction.

The discrete-rendering logic circuit, by enabling the selection of one of the input Schmitt triggers for the upward crossing of its top threshold and the other Schmitt trigger for the downward crossing of its bottom threshold while at the same time, when necessary, ensuring the sensitivity of these two Schmitt triggers to the crossings of these two thresholds, more than doubles the freedom of choice of the designer of ASIC digital integrated circuits, and this freedom of choice is all the greater as the number of types of input Schmitt triggers is great.

Advantageously, the circuit for the acquisition of a binary analog signal forms part of an encapsulated digital integrated circuit and has its different input Schmitt triggers connected at input to one and the same connection pin of the pack of the digital integrated circuit.

Advantageously, the encapsulated digital integrated circuit comprises several circuits of the same kind for the acquisition of a binary analog signal, each having their different input Schmitt triggers connected to the input of one and the same pin of the package of the digital integrated circuit and means for the individual testing of each of the thresholds of the triggers based on sequences of NAND type logic gates each connected to the outputs of one and the same type of Schmitt trigger.

Advantageously, the circuit for the acquisition of a binary analog signal, in addition to the Schmitt triggers with different switching thresholds, parallel-connected by their inputs and in addition to the discrete-rendering logic circuit, connected to the outputs of the Schmitt triggers, which deduces the state of the binary analog signal from the combination of the output states of the Schmitt triggers, comprises an output digital filter eliminating the transient noises caused by the asynchronous operation of the different Schmitt triggers.

Advantageously, the circuit for the acquisition of a binary analog signal, in addition to the Schmitt triggers with different switching thresholds, parallel-connected by their inputs, and in addition to the discrete-rendering logic circuit that is connected to the outputs of the Schmitt triggers and deduces the state of the binary analog signal from the combination of the output states of the Schmitt triggers, comprises malfunction detection means detecting the forbidden combinations between output states of the different Schmitt triggers.

Advantageously, the circuit for the acquisition of a binary analog signal, in addition to the Schmitt triggers with different switching thresholds, parallel-connected by their inputs, and the discrete-rendering logic circuit that is connected to the output of the Schmitt triggers and deduces the state of the binary analog signal from the combination of the output states of the Schmitt triggers, comprises malfunction detection means detecting the prohibited combinations between output states of the different Schmitt triggers and being activated only if forbidden combinations output states of the different Schmitt triggers are maintained beyond a certain duration.

Advantageously, the circuit for the acquisition of a binary analog signal comprises several different discrete-rendering logic circuits and one circuit for the selection of the output of one, as required, of these discrete-rendering logic circuits.

BRIEF DESCRIPTION OF THE DRAWINGS

Other advantages and features of the invention shall emerge from the following description of several embodiments given by way of an example, this description will be made with reference to the appended drawings, of which.

MORE DETAILED DESCRIPTION

Figure 1:
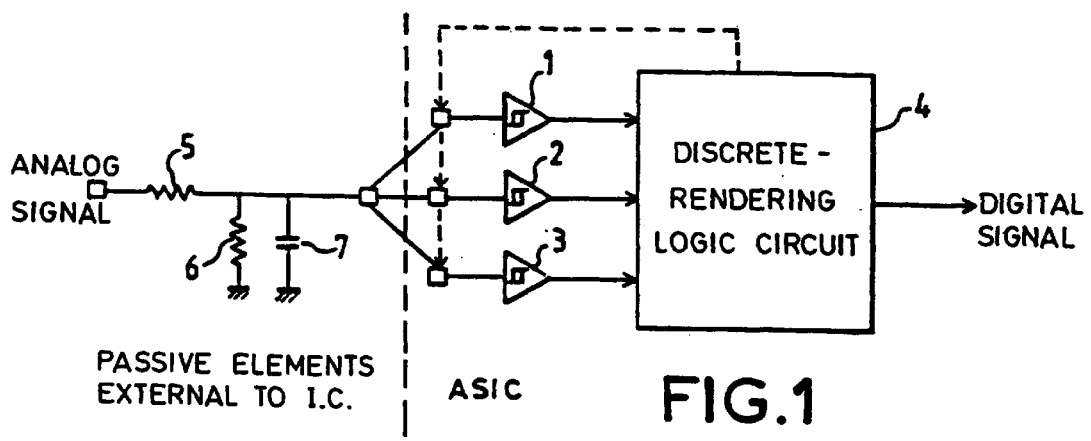
FIG. 1 is a drawing showing the general principle of a circuit for the acquisition of a binary analog signal according to the invention, preceded by a resistive voltage divider bridge achieving a voltage matching.

The circuit for the acquisition of a binary analog signal that is going to be described is integrated into the chip of an ASIC digital circuit. It is shown in FIG. 1, behind a purely passive analog stage, external to the chip of the ASIC digital integrated circuit, matching the range of variation of voltage of the binary analog signal with the range of variation of voltage accepted by the ASIC digital integrated circuit. It essentially has one input stage formed by a bank of Schmitt triggers 1, 2, 3 of different types whose inputs are parallel-connected and one output stage constituted by a discrete-rendering logic circuit 4 deducing the state of the binary analog signal from the combination of the output states of the bank of input Schmitt triggers 1, 2, 3 and acting, as the case may be, on the input signal (feedback connection shown in dashes) to sensitize the Schmitt triggers.

The input passive analog stage, which is external to the ASIC digital integrated circuit, is constituted in the usual way by a voltage divider bridge with two resistors 5, 6 complemented by a filtering capacitor 7. As indicated here above, it is used to match the range of voltage variation of the binary analog signal, which is often equal to several tens of volts, with the range of voltage variation accepted by the ASIC integrated circuit, which generally goes from 0 to 5 volts and is sometimes less.

The bank of Schmitt triggers 1, 2, 3, which is placed at the input of the binary analog signal acquisition signal itself, is constituted by at least two different types of Schmitt triggers whose cells in the ASIC digital integrated circuit have been pre-characterized and form part of a library of cells available to the designer of integrated circuits. These two types are for example the CMOS type with a hysteresis value of about 1.9 volts between the top and bottom switching thresholds of a trigger and the TTL type with a hysteresis value of about 0.6 volts between the top and bottom switching thresholds of a trigger. Naturally, there may be other types of Schmitt trigger with different hysteresis values. For this purpose, it is enough that the other types should be pre-characterized and appear in the library of cells available to the designer of ASIC integrated circuits.

Figure 2:
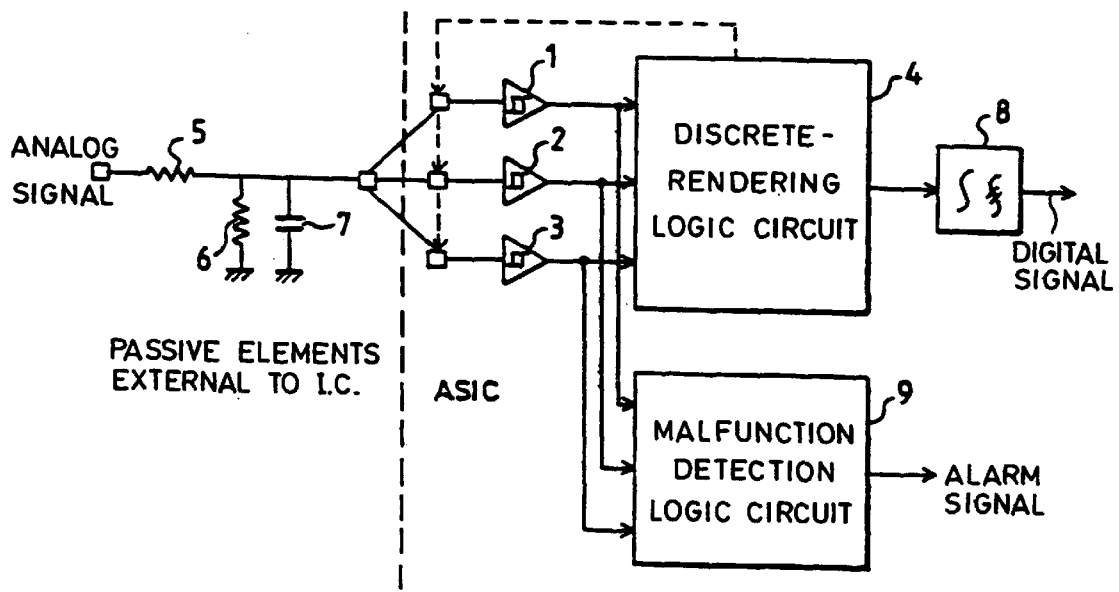
FIG. 2 is a drawing of a circuit in accordance with that of FIG. 1, complemented by a noise-preventive digital filter and a malfunction detection circuit.

The discrete-rendering logic circuit 4 is a combinational and/or sequential logic circuit, possibly even of the memory type, that deduces the state of the binary analog signal from the combination of the output states of the different Schmitt triggers 1, 2, 3. As shown in FIG. 2, it may be followed by a noise-preventive digital filter 8 and supplemented by a malfunction detection circuit 9.

The noise-preventive digital filter makes it possible to get rid of the transients due to the asynchronous operation of the different Schmitt triggers. The filtering capacitor 7 of the input passive analog stage then fulfills the role of an anti-aliasing filter needed for the efficient operation of this noise-preventive digital filter.

The malfunction detection circuit 9 is a combinational and/or sequential logic circuit, possibly even of the memory type, which identifies the forbidden combinations of the output states of the Schmitt triggers 1, 2, 3 for purposes of malfunction detection. It sends out an alarm signal when it notes that a forbidden combination between the output states of the different Schmitt triggers has been maintained beyond a certain duration.

Figure 3:
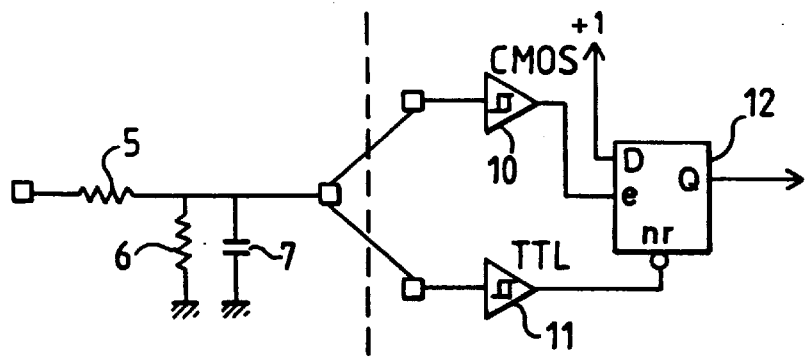
FIG. 3 is a drawing of a circuit for the acquisition of a binary analog signal according to the invention comprising two types of trigger at input, one meeting the CMOS standard and the other meeting the TTL standard, and a discrete-rendering logic circuit based on a storage register enabling the selection of the CMOS top threshold and the TTL bottom threshold.

FIG. 3 illustrates a practical embodiment of a circuit for the acquisition of a binary analog signal in the frequent case where the library of cells available to the designer of ASIC integrated circuits contains only two types of Schmitt trigger, one using the CMOS standard and the other the TTL standard, and where it is sought to increase the hysteresis. Advantage is then taken of the staging of the top and bottom switching thresholds of the CMOS and TTL type Schmitt triggers resulting from the fact that the CMOS top switching threshold is higher than the TTL top switching threshold, which is itself higher than the CMOS bottom switching threshold, which is itself higher than the TTL bottom switching threshold, and, as the top switching threshold, it is chosen to have the CMOS standard top switching threshold that is the highest of the thresholds and, as the bottom switching threshold, it is chosen to have the TTL standard bottom switching threshold that is the lowest of the thresholds. The bank of input Schmitt triggers consists of a CMOS standard Schmitt trigger 10 and a TTL standard Schmitt trigger 11 and the discrete-rendering logic circuit consists of a storage register 12 that is level-activated. The storage register 12 has a data input D carried to the logic +1 level, a write-enable input e connected to the output of the CMOS standard Schmitt trigger 10, a priority zero-resetting complemented input nr connected to the output of the TTL standard Schmitt trigger 11 and a data input Q. The output Q of the storage register 12 goes to the logic 1 level whenever the input binary analog signal crosses the top threshold of the CMOS standard Schmitt trigger in the upward direction and it goes to the logic 0 level whenever the input analog signal crosses the bottom threshold of the TTL standard Schmitt trigger in the downward direction. Thus, for the circuit for the acquisition of a binary analog signal, there is obtained a top threshold equivalent to the highest of the top thresholds and a bottom threshold equivalent to the lowest of the bottom thresholds of its Schmitt triggers.

Figure 4:
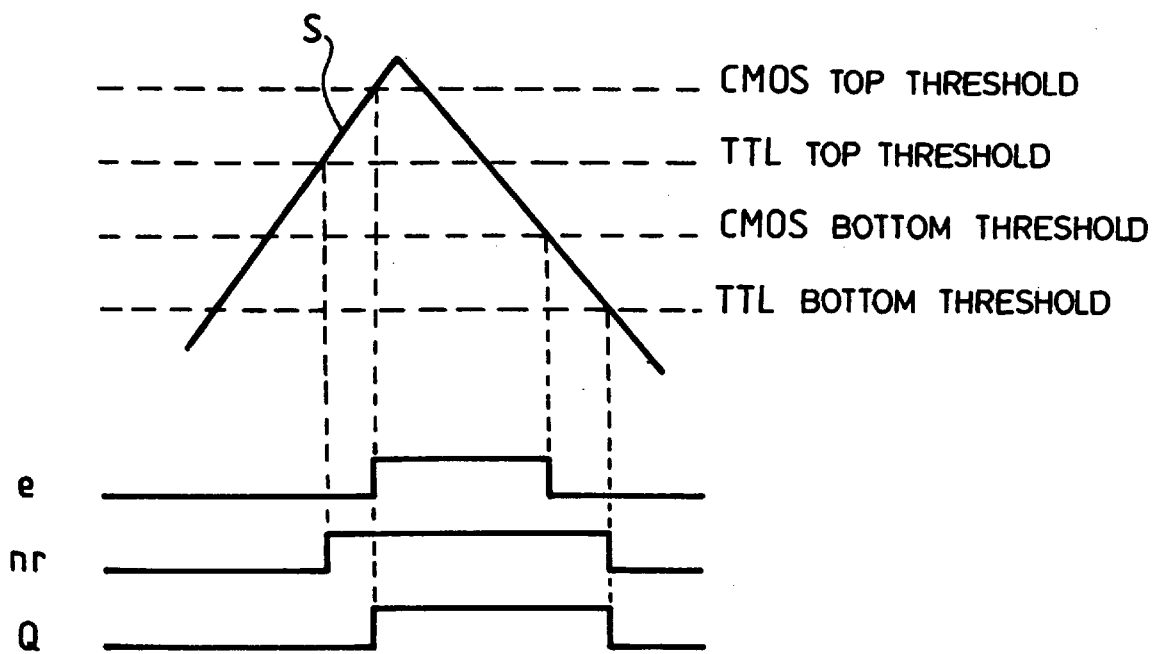
FIG. 4 is a graph of curves illustrating the working of the circuit of FIG. 3.

FIG. 4 is a graph of curves that illustrates this operation. This figure shows:

- a triangular input signal S crossing, in the course of time, all the four switching thresholds of the CMOS and TTL standard Schmitt triggers in the upward and then the downward directions,
- the signal e which results, at output of the CMOS standard trigger 10, from the application of the input signal S and is retrieved at the write-enable input e of the storage register 12,
- the signal nr which results, at output of the TTL standard trigger 11, from the application of the input signal S and is retrieved at the complemented priority zero-setting input nr of the storage register 12, and
- the signal Q which results, at the output Q of the storage register 12, from the application of the input signal S.

It can be seen that it is not necessary to sensitize the triggers to the crossings of the chosen switching thresholds chosen for they are necessary to it, since the chosen switching thresholds enclose the other two switching thresholds and since their successive crossings imply the crossings of the other two switching thresholds.

The same result could have been obtained by replacing the storage register 12 of the discrete-rendering logic circuit by an AND type logic gate.

If it is desired, on the contrary, to reduce the hysteresis, namely to select, as a top switching threshold, the top threshold of the TTL standard Schmitt trigger that is the lowest of the top switching thresholds and, as the bottom switching threshold, the bottom threshold of the CMOS standard Schmitt trigger that is the highest of the bottom switching thresholds, it is not enough to exchange the CMOS and TTL standard Schmitt triggers. It is also necessary to complement the assembly according to FIG. 5, firstly to oblige the CMOS standard trigger with the highest top switching threshold to be switched over to the high state when the top switching threshold of the TTL standard trigger is crossed in the upward direction, for the input binary analog signal may cross the top switching threshold of the TTL trigger in the upward direction without waiting for the top switching threshold of the CMOS trigger, and secondly to oblige the TTL standard trigger, with a lowest bottom switching threshold to switch over to the low state when the bottom switching threshold of the CMOS standard trigger is crossed in the downward direction, for the binary input analog signal may cross the bottom switching threshold of the CMOS standard trigger in the downward direction without reaching the bottom switching threshold of the TTL trigger.

Figure 5:
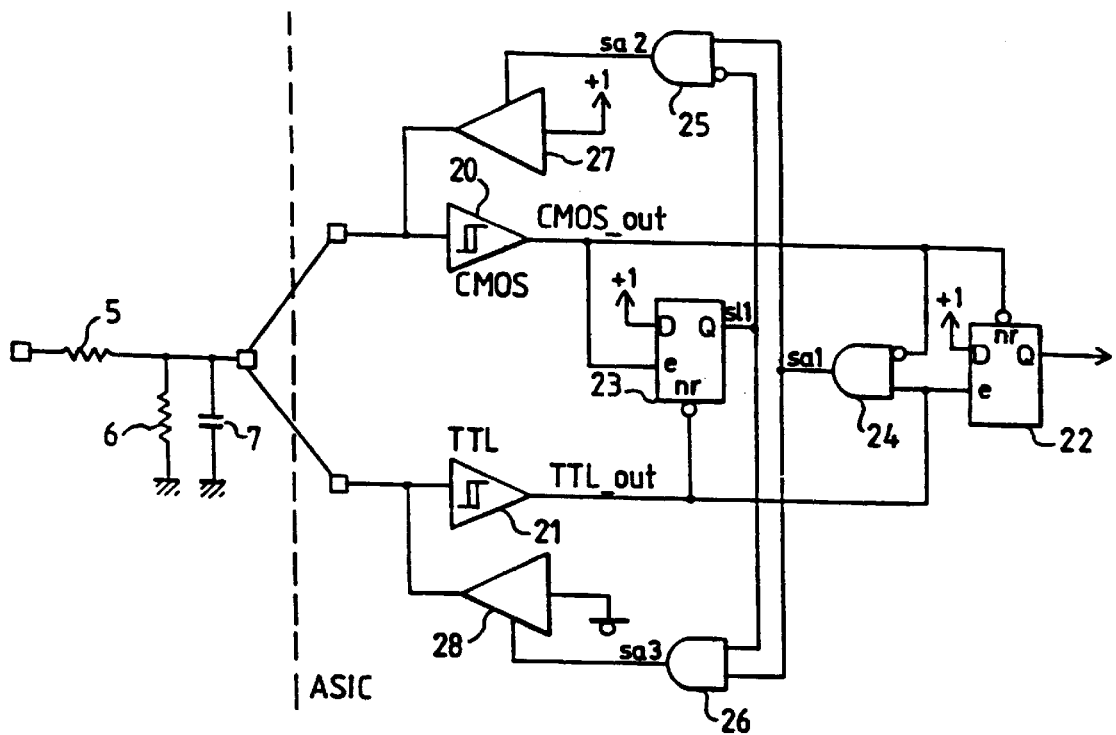
FIG. 5 is a drawing of a circuit for the acquisition of a binary analog signal according to the invention comprising two types of input trigger, one meeting the CMOS standard and the other the TTL standard, and a discrete-rendering logic circuit based on storage registers and logic gates enabling the selection of a TTL top threshold and the CMOS bottom threshold.

This FIG. 5 shows the input passive analog stage, external to the ASIC digital integrated circuit, constituted by the voltage divider bridge with two resistors 5, 6 complemented by the filtering capacitor 7. The output of this passive analog stage leads to a bank of two input Schmitt triggers, one CMOS standard Schmitt trigger 20 and the other TTL standard Schmitt trigger 21, which are interposed before a discrete-rendering logic circuit that comprises:

- a first storage register 22 that is level-activated, with a data input D taken to the logic level +1, a write-enable input e connected to the output of the TTL standard Schmitt trigger 21, a priority zero-setting complemented input nr connected to the output of the CMOS standard Schmitt trigger 20 and a data output Q delivering the general output signal of the assembly,
- a second storage register 23 that is input-activated, with a data input D taken to the logic level +1, a write-enable input e connected to the output of the CMOS standard Schmitt trigger 20, a priority zero-setting complementary input nr connected to the output of the TTL standard Schmitt trigger 21 and a data output Q,
- a first AND type logic gate 24 with two inputs, one of which is complemented, connected by its complemented input to the output of the CMOS standard Schmitt trigger 20 and by its non-complemented input to the output of the TTL standard Schmitt trigger 21,
- a second AND type logic gate 25 with two inputs, one of which is complemented, connected by its complemented input to the data output Q of the second storage register 23 and by its non-complemented input to the output of the first logic gate 24,
- a third AND type logic gate 26 with two non-complemented inputs, one connected to the data output Q of the second storage register 23 and the other to the output of the first logic gate 24,
- a first three-state output digital circuit 27 with one data input carried to the logic +1 level, an inhibition input connected to the output of the second logic gate 25 and a data output feedback connected to the input of the CMOS standard Schmitt trigger 20, and
- a second three-state output digital circuit 28 with one data input carried to the logic 0 level, an inhibition input connected to the output of the third logic gate 26 and a data output feedback connected to the input of the TTL standard Schmitt trigger 21.

When they are not inhibited, the output digital circuits 27, 28 impose their +1 or 0 output levels on the inputs of the Schmitt triggers 20, 21 owing to the non-zero output impedance of the input analog state used for the scaling of the zone of variation of the input binary analog signal.

The first storage circuit 22 of the discrete-rendering logic circuit, which delivers the output signal at its data output Q, goes to the logic 1 level whenever the TTL standard Schmitt trigger 21 switches over to the high state and to the logic 0 level whenever the CMOS standard Schmitt trigger 20 switches over to the bottom state. It can be seen that, to obtain a Schmitt trigger operation whose top threshold is that of the TTL standard and whose bottom threshold is that of the CMOS standard, the two CMOS and TTL standard Schmitt triggers 20, 21 should be sensitive to the passage of the one from its bottom threshold when the top threshold of the other has been crossed and to the passage of the other from its top threshold when the bottom threshold of the one has been crossed. This implies that they have previously perceived the input binary analog signal cross the other threshold in the opposite direction. This condition is not necessarily achieved for all the waveforms of the input binary analog signal, especially if the excursion of the signal does not cross all the thresholds. To overcome this drawback, the first storage register 22 is supplemented by setting circuits which modify the amplitude of the input binary analog signal for a brief instant to ensure the sensitivity of the Schmitt triggers 20, 21 to the crossing of the TTL top and CMOS bottom thresholds.

The first logic gate 24 detects the points in time during which the input binary analog signal has crossed the TTL top threshold in the upward direction but has not yet crossed the CMOS top threshold or else has crossed the CMOS bottom threshold in the downward direction but has not yet crossed the TTL bottom threshold. Its output signal "sa1" thus identifies the instants where a setting may prove to be necessary so as to subsequently make one of the triggers sensitive to the crossing of its antagonistic threshold.

The second storage register 23 identifies that one of the Schmitt triggers 20, 21 that is liable to be set. If its data output Q is at the logic 0 level, it means that the amplitude of the input binary analog signal has gone below the TTL bottom threshold without yet having returned above the CMOS top threshold and that the threshold to be set is possibly the CMOS top threshold. If its data output Q is at the logic 1 level, it means that the amplitude of the input binary analog signal has gone below the CMOS top threshold without yet having returned below the TTL bottom threshold and that the threshold to be set is possibly the TTL bottom threshold.

The second logic gate 25 combines a logic 0 level at output of the second storage register 23 and a logic 1 level at output of the first logic gate 24 to prompt a temporary setting of the amplitude of the input binary analog signal beyond the top switching threshold of the CMOS standard trigger.

The third logic gate 26 combines a logic 1 level at output of the second storage register 23 and a logic 1 level at output of the first logic gate 24 to prompt a temporary setting of the amplitude of the input binary analog signal below the bottom switching threshold of the TTL standard trigger.

Figure 6:
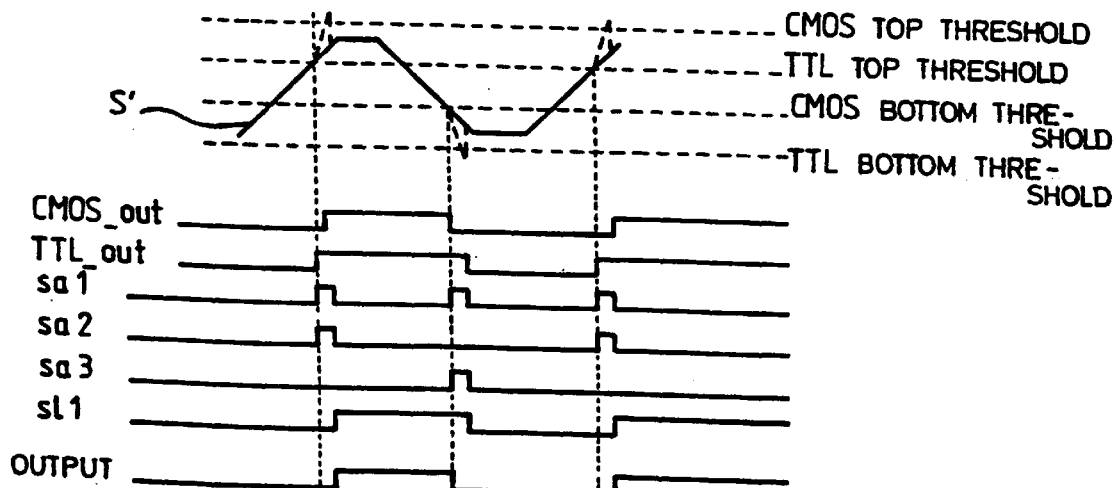
FIG. 6 is a graph of curves illustrating the working of the circuit of FIG. 5.

The graphs of FIG. 6 illustrate the shape of the different signals found at different points of the drawing of FIG. 5 for an input binary analog signal S' evolving between the CMOS top switching threshold and the TTL bottom switching threshold, without awaiting them for all that. The curve CMOS_out illustrates the shape of the signal at output of the CMOS standard Schmitt trigger 20 given the effects of the setting circuit. The curve TTL_out illustrates the shape of the signal at output of the TTL standard Schmitt trigger 21 given the effects of the setting circuit. The curve sa1 illustrates the shape of the output signal form the first logic gate 24. It can be seen that it goes to the logic 1 level whenever a setting in one direction or in the other may prove to be necessary. The curve sa2 illustrates the shape of the output signal of the second logic gate 25. It can be seen that it goes to the logic 1 level whenever a setting of the input binary analog signal beyond the CMOS top switching threshold might prove to be necessary. The curve sa3 illustrates the shape of the output signal of the third logic gate 26. It can be seen that it goes to the logic 1 level whenever a setting of the input binary analog signal below the TTL bottom switching threshold might prove to be necessary. The curve sl1 illustrates the shape of the signal at the data output Q of the second storage register 23 and the curve SORTIE shows the shape of the signal at output of the discrete-rendering logic circuit.

It will be noted that the first storage register 22 could be replaced by an OR type logic gate.

More generally, the precise constitution of the discrete-rendering logic circuit depends on the result sought, namely the two combinations of the output states of the Schmitt triggers of the input stage to be associated with the two states of the binary analog signal. It can even be envisaged, when it is possible to change the input binary analog signal, to provide for a choice between several different selections of top and bottom thresholds in connecting several different discrete-rendering logic circuits in parallel at the outputs of the bank of input triggers and in positioning a selector circuit at the outputs of the different discrete-rendering logic circuits.

Figure 7:
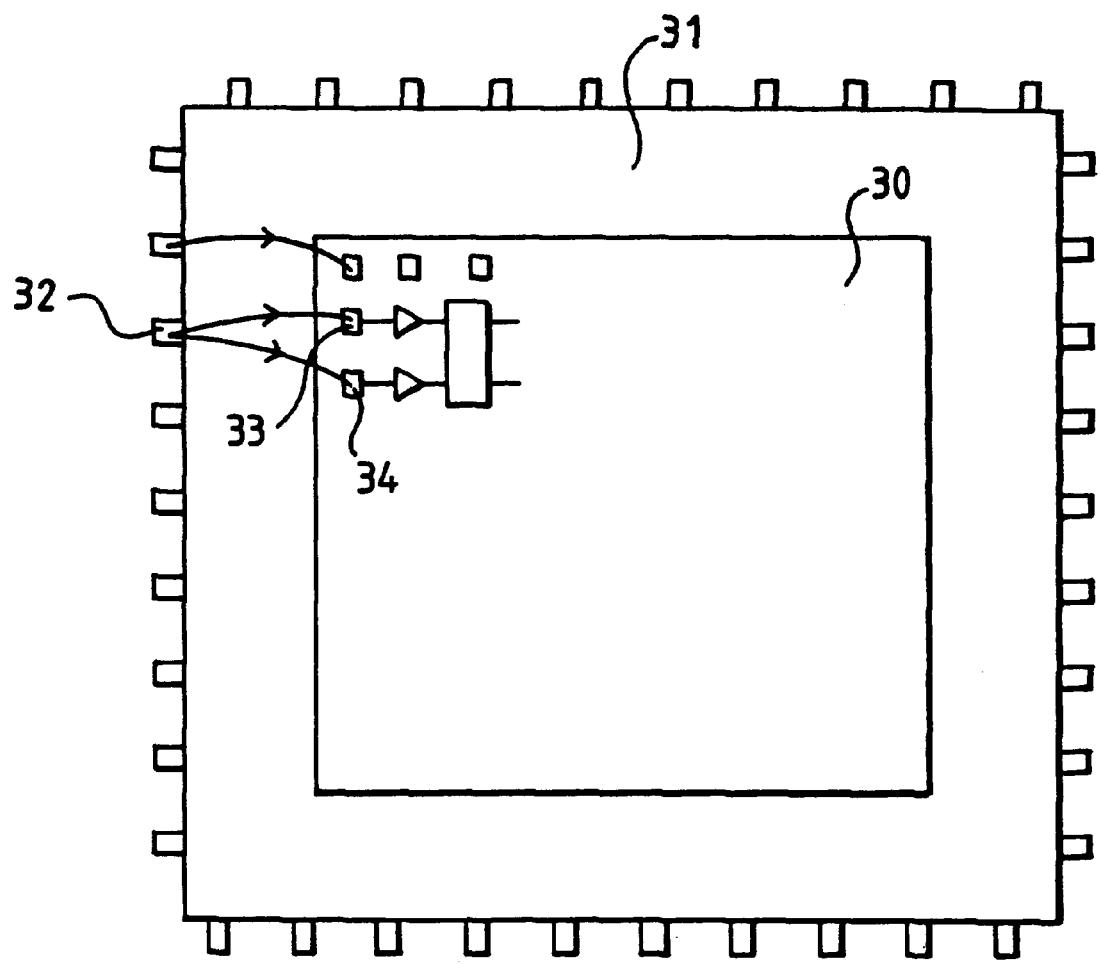
FIG. 7 is a drawing illustrating the wiring of the connection zones of an ASIC integrated circuit chip to the connection pads of its package in the case of the trigger inputs of a circuit for the acquisition of a binary analog circuit according to the invention.

FIG. 7 gives a very schematic view of the chip of an integrated circuit 30 in its pack 31 to illustrate the connections by conductive wire between the connection pins 32 of the pack 31 and the connection pads 33, 34 of the chip 30. In the case of the circuit for the acquisition of a binary analog signal, the inputs of the Schmitt triggers are parallel-connected, so much so that it is possible to connect their connection pads 33, 34 to one and the same connection pin 32. This makes it possible to limit the number of connection pins of the pack of the integrated circuit. In this case, to preserve the capacity for the testing, in production, of the thresholds of each of the triggers, the technique of the NAND type logic gate sequences known as the nand tree technique is used. In this technique, as many sequences of NAND type logic gates are used as there are Schmitt triggers parallel-connected to the input of the binary analog signal acquisition circuits.

Figure 8:
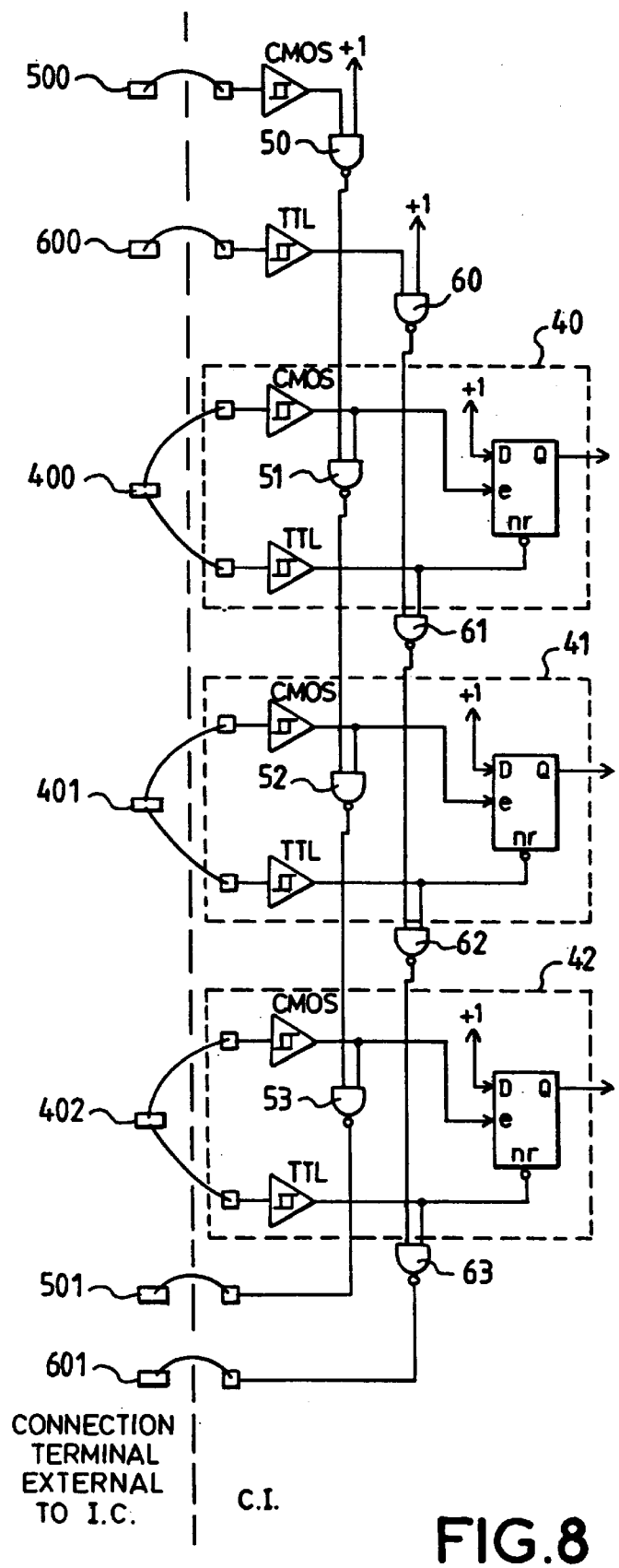
FIG. 8 is a drawing illustrating the configuration of a test logic device for the testing of the input triggers of a circuit for the acquisition of a binary analog signal according to the invention.

FIG. 8 illustrates the implementation of the nand tree technique in the case of an ASIC digital integrated circuit containing three circuits for the acquisition of a binary analog signal 40, 41 and 42 respectively, of the same type as that of FIG. 3, each having the inputs of their two Schmitt triggers wired to one and the same connection terminal 400, 401 and 402 respectively of the package of the ASIC digital integrated circuit. There are two sequences of NAND type logic gates: a first sequence 50, 51, 52, 53 to test the CMOS type Schmitt triggers and a second sequence 60, 61, 62, 63 to test the TTL type Schmitt triggers.

The sequence for testing the CMOS type Schmitt triggers has a first NAND type logic gate 50 and two inputs with one input taken to the logic +1 level and the other connected to a specific connection terminal 500 of the package of the ASIC integrated circuit by means of a Schmitt trigger. Following this first logic gate 50, there is a second NAND type two-input logic gate 51 with one input connected to the output of the first logic gate 50 and one input connected to the output of the CMOS type Schmitt trigger of a first acquisition circuit 40. Following this second logic gate 51, there is a third NAND type two-input logic gate 52 with one input connected to the output of the second logic gate 51 and one input connected to the output of the CMOS type Schmitt trigger of a second acquisition circuit 41. Following this third logic gate 52, there are other NAND type two-input logic gates 53 connected in the same way until all the CMOS type Schmitt triggers of all the acquisition circuits 40, 41, 42 have been covered, the last such logic gate 53 having its output connected to an individual connection terminal 501 of the package of the ASIC integrated circuit.

The sequence for testing the TTL type Schmitt triggers has a similar structure with different NAND type two-input logic gates 60, 61, 62, 63 and two individual connection terminals on the package of the ASIC integrated circuit, one 600 for its input and the other 601 for its output.

During a test by means of one of the sequences, all the inputs of the sequence are initially taken to the logic +1 level. At an initial stage, a logic 0 level is gradually applied to all the inputs of the sequence, going from the beginning to the end of the sequence. Then, in a second stage, a logic +1 level is gradually applied to all the inputs of the sequence, going from the end to the beginning of the sequence. During these gradual modifications of the logic levels applied to the inputs of the sequence, it must be noted that there are logic level switchings at output of the sequence. These switchings are each due to the insulated switching, in the upward direction or downward direction, of one of the Schmitt triggers being tested and thus enable an individual appreciation of the top and bottom thresholds of these triggers.

What is claimed is:

1. A circuit for the acquisition of a binary analog signal comprising, at input, at least two Schmitt triggers with staged top and bottom switching thresholds parallel-connected by their inputs and followed at output by at least one discrete-rendering logic circuit that changes state, on the one hand, when the Schmitt trigger with the highest top switching threshold passes to the logic 1 level and, on the other hand, when the Schmitt trigger with the lowest bottom switching threshold passes to the logic 0 level.

2. A circuit according to claim 1, wherein the discrete-rendering logic circuit is an AND type logic gate.

3. A circuit according to claim 1, wherein the discrete-rendering logic circuit is a storage register with a data input D placed at the logic +1 level, a write-enable input e connected to the output of one of the Schmitt triggers and a priority zero-resetting complemented input nr connected to the output of the other of the Schmitt triggers.

4. A circuit for the acquisition of a binary analog signal comprising, at input, at least two Schmitt triggers with staged top and bottom switching thresholds parallel-connected by their inputs and followed at output by at least one discrete-rendering logic circuit that changes state, on the one hand, when the Schmitt trigger with the highest bottom switching threshold passes to the logic 0 level and, on the other hand, when the Schmitt trigger with the lowest top switching threshold passes to the logic 1 level, and comprising a feedback circuit which, for a brief instant, force the Schmitt trigger with the highest top switching threshold to cross its top threshold as soon as the input signal has crossed the top threshold of the other Schmitt trigger in the upward direction, and force the Schmitt trigger with the lowest bottom switching threshold to cross its bottom threshold as soon as the input signal has crossed the bottom threshold of the other Schmitt trigger in the downward direction.

5. A circuit according to claim 4, wherein the feedback circuit comprises:
 at least one output digital circuit configured to send one of the logic 0 level and the logic 1 level to at least one of the Schmitt triggers;
 at least one output logic gate configured to send a first signal to the at least one output digital circuit; and
 an input logic gate configured to receive a second signal from the at least one discrete-rendering logic circuit and send a third signal to the at least one output logic gate.

6. A circuit according to claim 5, wherein the at least one output logic gate and the input logic gate are AND type logic gates.

7. A circuit according to claim 4, wherein the discrete-rendering logic circuit is an OR type logic gate.

8. A circuit according to claim 4, wherein the discrete-rendering logic circuit is a storage register with a data input D placed at the logic +1 level, a write-enable input e connected to the output of one of the Schmitt triggers and a priority zero-resetting complemented input nr connected to the output of the other of the Schmitt triggers.

9. A circuit according to claim 1 or claim 4, furthermore comprising a malfunction-detection logic circuit that is parallel-connected at input to the discrete-rendering logic circuit and detects the forbidden combinations between output states of the different input Schmitt triggers.

10. A circuit according to claim 9, wherein the malfunction-detection logic circuit generates an alarm signal in the event of the maintenance of forbidden combinations between output states of the different input Schmitt triggers beyond a certain duration.

11. A circuit according to claim 1 or claim 4, forming part of an encapsulated integrated circuit, wherein the circuit has its different input Schmitt triggers connected at input to one and the same connection pin of the pack of the digital integrated circuit.

12. A circuit according to claim 1 or claim 4, several circuits of this kind forming part of one and the same encapsulated digital integrated circuit, wherein the encapsulated integrated circuit is equipped with means for the individual testing of each of the thresholds of the Schmitt triggers of the different circuits of the same kind, said testing means being based on sequences of NAND type logic gates each connected to the outputs of one and the same type of Schmitt trigger.

13. A circuit according to claim 1 or claim 4, furthermore comprising a noise-preventive digital filter connected to the output of the discrete-rendering logic circuit.

14. A circuit according to claim 1 or claim 4, comprising several different discrete-rendering logic circuits parallel-connected to the outputs of the input Schmitt triggers and followed by a circuit for the selection of the output signal of one of them.

* * * * *